United States Patent
Hotta

(10) Patent No.: US 6,964,891 B2
(45) Date of Patent: Nov. 15, 2005

(54) THIN FILM TRANSISTOR SUBSTRATE AND ITS MANUFACTURE

(75) Inventor: Kazushige Hotta, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/766,559

(22) Filed: Jan. 27, 2004

(65) Prior Publication Data

US 2004/0191972 A1 Sep. 30, 2004

(30) Foreign Application Priority Data

Jan. 27, 2003 (JP) .............................. 2003-017306

(51) Int. Cl.$^7$ .......................................... H01L 21/336
(52) U.S. Cl. ........................ 438/197; 257/408; 257/407
(58) Field of Search ............................... 438/197, 199; 257/408

(56) References Cited

U.S. PATENT DOCUMENTS

| | | | |
|---|---|---|---|
| 5,146,300 A | * | 9/1992 | Hamamoto et al. ......... 257/300 |
| 5,399,514 A | * | 3/1995 | Ichikawa .................... 438/200 |
| 6,046,484 A | * | 4/2000 | Kodaira ...................... 257/408 |
| 2002/0182756 A1 | * | 12/2002 | Kang ............................. 438/3 |
| 2003/0030115 A1 | * | 2/2003 | Kikuchi et al. ............. 257/408 |
| 2004/0179144 A1 | * | 9/2004 | Jeon ............................ 349/43 |

FOREIGN PATENT DOCUMENTS

| | | |
|---|---|---|
| JP | 03-006865 | 1/1991 |
| JP | 04-290467 | 10/1992 |
| JP | 11-135801 | 5/1999 |
| JP | 2001-092373 | 4/2001 |

* cited by examiner

Primary Examiner—Thao P. Le
(74) Attorney, Agent, or Firm—Greer, Burns & Crain, Ltd.

(57) ABSTRACT

A semiconductor layer with a threshold voltage for n-channel is formed and patterned to TFT island areas. A gate insulating film is deposited. The first gate electrode layer is formed and pattered to form an opening. Phosphorous ions are implanted into a p-channel TFT in the opening to set threshold voltage for p-channel TFT. A second gate electrode layer is formed and patterned to form second gate electrodes. By using the first gate electrode layer as a mask, boron ions are implanted at a high concentration to form source/drain regions of the p-channel TFT. By using the second gate electrodes as a mask, the first gate electrode layer is etched to form gate electrodes. Phosphorous ions are implanted at a low concentration to form LDD regions. By using a fourth mask, P ions are implanted at a high concentration to form source/drain regions of n-channel TFTs.

8 Claims, 11 Drawing Sheets

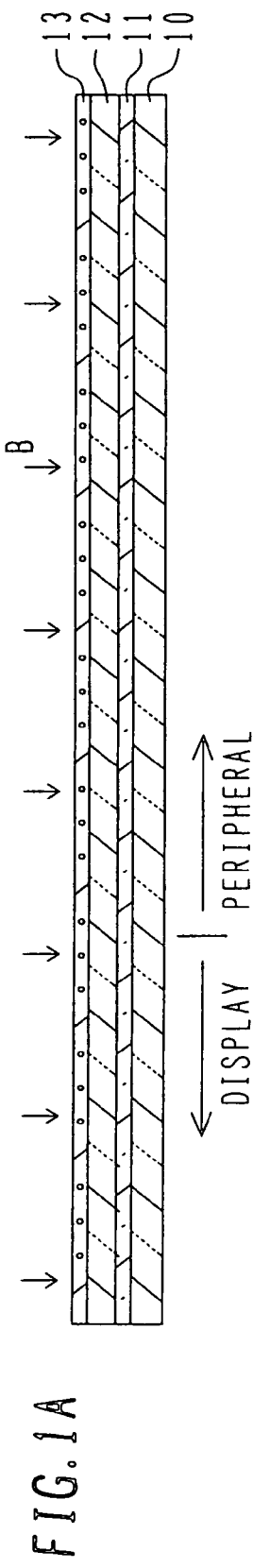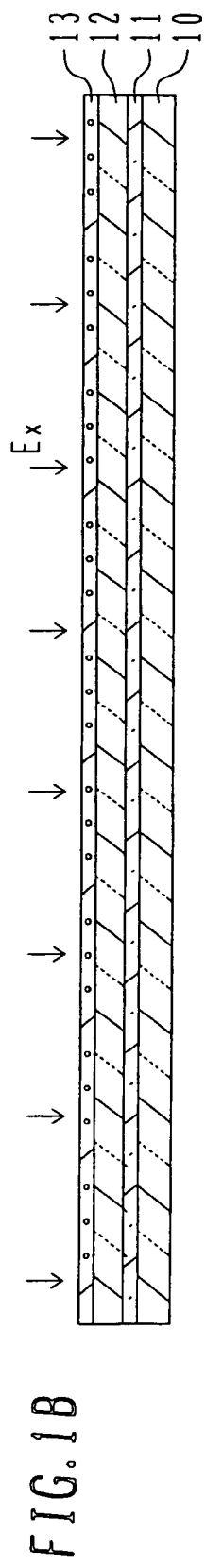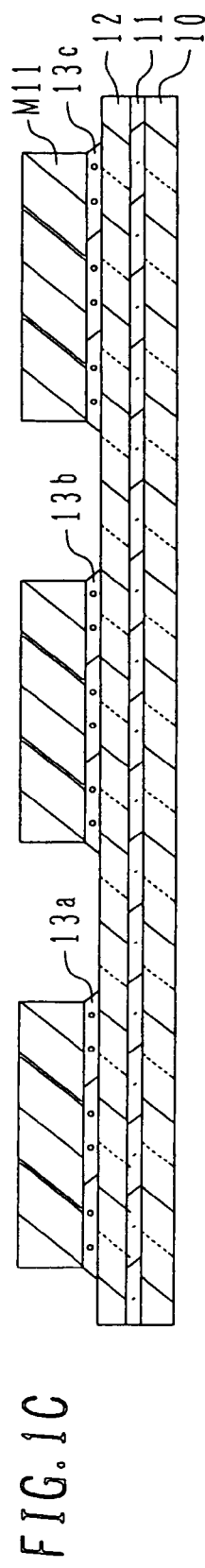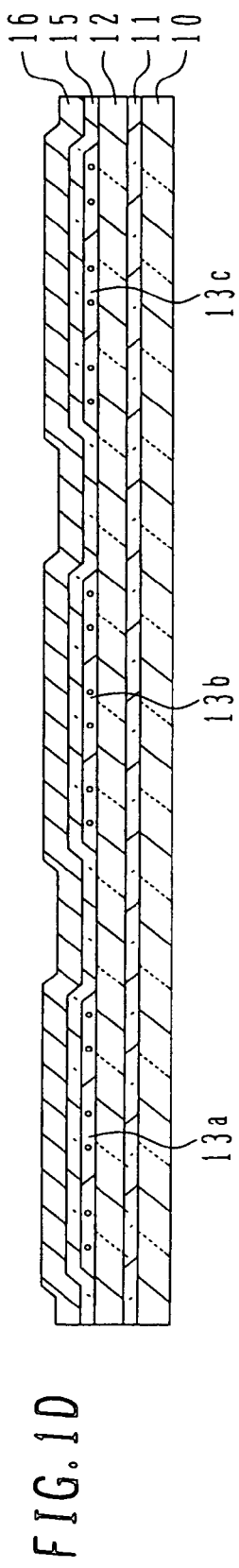

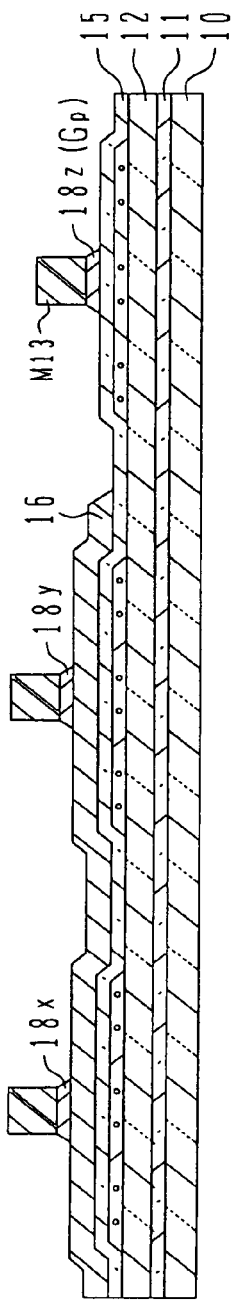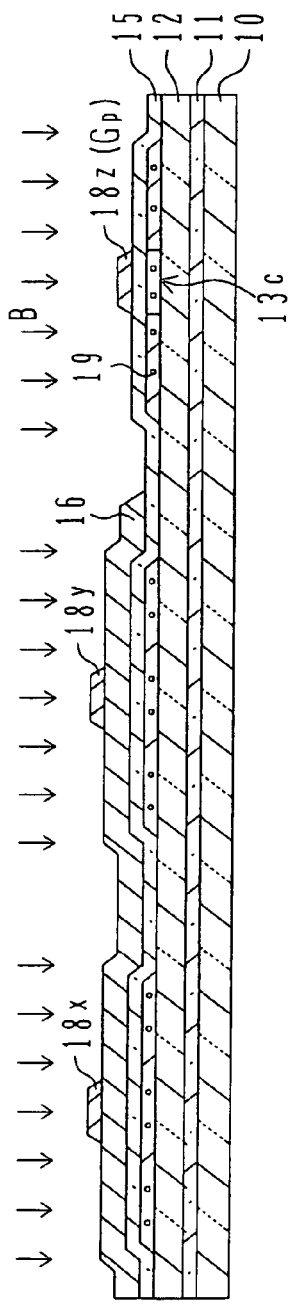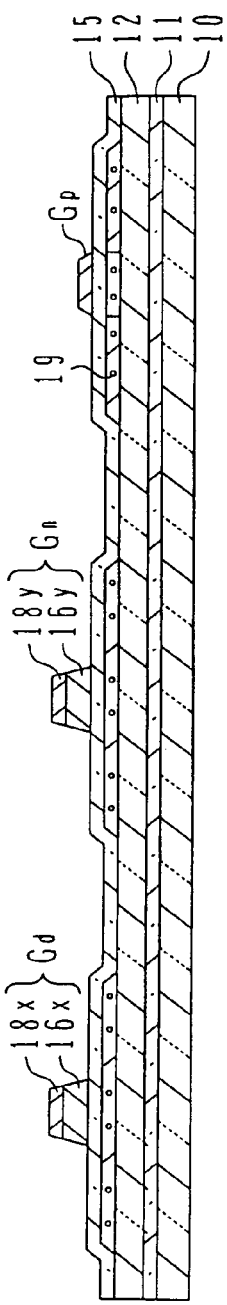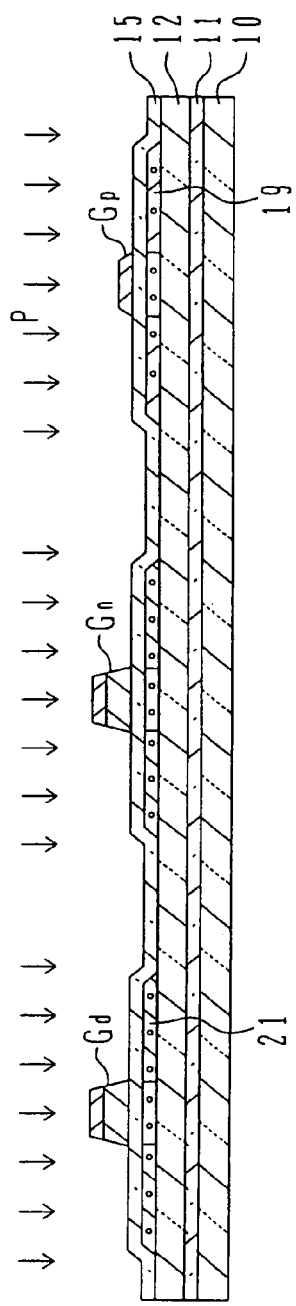

THIN FILM TRANSISTOR SUBSTRATE AND ITS MANUFACTURE

CROSS REFERENCE TO RELATED APPLICATION

This application is based on and claims priority of Japanese Patent Application No. 2003-017306 filed on Jan. 27, 2003, the entire contents of which are incorporated herein by reference.

BACKGROUND OF THE INVENTION

A) Field of the Invention

The present invention relates to a thin film transistor substrate and its manufacture method, and more particularly to a thin film transistor substrate having n- and p-channel transistors and its manufacture method.

B) Description of the Related Art

Thin film transistors are used for driving pixels of a liquid crystal display. For example, by using a polysilicon thin film, pixel driving thin film transistors can be formed in a display area and peripheral circuit thin film transistors can be formed in an area other than the display area.

Pixel driving thin film transistors are required to have a small leak current and are made of n-channel MOS thin film transistors (TFT) having lightly doped drain (LDD) regions. Peripheral circuit thin film transistors are required to have a small power consumption and are preferably made of complimentary (C) MOSTFTs. For a stable operation, n-channel TFTs of CMOSTFTs are desired to have the LDD structure. If a high speed operation is desired, it is preferable that both p-channel and n-channel transistors of CMOSTFTs have the structure without LDD regions, because the LDD regions hinder the high speed operation.

As an amorphous silicon thin film formed on a glass substrate is polycrystallized by applying an excimer laser beam, the threshold voltage of the polysilicon thin film transistor shifts largely to the minus side. It is necessary to dope p-type impurities such as boron to set the threshold voltage to 0 V (for example, refer to Japanese Patent Laid-open Publication HEI-03-006865).

Even if the threshold voltage is adjusted to 0 V, it is difficult to lower leak current at a voltage 0 of both n- and p-channel transistors due to a small margin.

In order to adjust the threshold voltages of both n- and p-channel transistors to have desired values, it is necessary to perform different impurity doping processes for n- and p-channel transistors (for example, refer to Japanese Patent Laid-open Publications HEI-04-290467, HEI-11-135801, and 2001-092373). At least one mask is therefore required.

Two masks are required to form high impurity concentration source/drain regions. Two masks are required to pattern a silicon thin film and a gate electrode layer. Five masks at the minimum are therefore required to manufacture CMOS TFTs. It is desired to reduce the number of masks in order to manufacture liquid crystal displays with a high manufacture yield and at a low manufacture cost.

SUMMARY OF THE INVENTION

It is an object of the present invention to provide a method of manufacturing a thin film transistor substrate capable of controlling the threshold voltages of both n- and p-channel transistors independently by using the smaller number of masks.

It is another object of the present invention to provide a thin film transistor substrate having the threshold voltages of both n- and p-channel transistors controlled independently and manufactured by using the smaller number of masks.

According to one aspect of the present invention, there is provided a manufacture method for a thin film transistor substrate, comprising the steps of: (a) forming a semiconductor layer on a substrate, the semiconductor layer having a threshold voltage suitable for an n-channel transistor; (b) patterning the semiconductor layer into island areas by using a first mask to define an area of a pixel driving n-channel transistor with LDD regions, an area of a CMOS n-channel transistor and an area of a CMOS p-channel transistor; (c) forming a gate insulating film and a first gate electrode layer to cover the semiconductor layer patterned to form the island areas; (d) patterning the first gate electrode layer by using a second mask to form a first gate electrode layer having an opening in the CMOS p-channel transistor area; (e) by using the first gate electrode layer as a mask, implanting n-type impurity ions into the CMOS p-channel transistor area in the opening to set a threshold voltage suitable for the CMOS p-channel transistor; (f) after the step (e), forming a second gate electrode layer covering the first gate electrode layer; (g) etching the second gate electrode layer by using a third mask to form second gate electrodes having a gate electrode shape; (h) by using the second gate electrodes and the first gate electrode layer as a mask, implanting high concentration p-type impurity ions into the CMOS p-channel transistor area to form high impurity concentration source/drain regions; (i) by using the second gate electrodes as a mask, etching the first gate electrode layer to form gate electrodes of the n-channel transistors; (j) implanting low concentration n-type impurity ions to form the LDD regions in the area of the n-channel transistor with the LDD regions; and (k) by using a fourth mask covering the CMOS p-channel transistor area and the LDD regions in the area of the n-channel transistor with the LDD regions, implanting high concentration n-type impurity ions to form high impurity concentration source/drain regions of the n-channel transistors.

According to another aspect of the present invention, there is provided a manufacture method for a thin film transistor substrate, comprising the steps of: (a) forming a semiconductor layer on a substrate, the semiconductor layer having a threshold voltage suitable for a p-channel transistor; (b) pattering the semiconductor layer into island areas by using a first mask to define an area of a pixel driving n-channel transistor with LDD regions, an area of a CMOS n-channel transistor and an area of a CMOS p-channel transistor; (c) forming a gate insulating film and a first gate electrode layer to cover the semiconductor layer patterned to form the island areas; (d) patterning the first gate electrode layer by using a second mask to form a first gate electrode layer covering the CMOS p-channel transistor area and having an opening in the n-channel transistor areas; (e) by using the first gate electrode layer as a mask, implanting p-type low concentration impurity ions into the n-channel transistor areas in the opening to set a threshold voltage suitable for the n-channel transistors; (f) after the step (e), forming a second gate electrode layer covering the first gate electrode layer; (g) etching the second gate electrode layer by using a third mask to form a second gate electrode layer having a gate electrode shape covering a channel region and the LDD regions in the area of the n-channel transistor with the LDD regions and having a gate electrode shape covering each channel region of the other transistor areas; (h) by using the second gate electrode layer and the first gate electrode layer as a mask, implanting first high concentration impurity ions into the n-channel transistor areas to form high impurity concentration source/drain regions; (i) by using the second gate electrode layer as a mask, etching the first gate electrode layer; (j) forming a fourth mask exposing the CMOS p-channel transistor area and covering at least a gate electrode area in the area of the n-channel transistor with the LDD regions; (k) implanting second high concentration p-type impurity ions having a concentration lower than the first high concentration to form high impurity concentration source/drain regions in the p-channel transistor area; (l) by using the fourth mask as an etching mask, etching the second gate electrode layer to pattern a gate electrode of the n-channel transistor with the LDD regions; and (m) implanting low concentration n-type impurity ions to form the LDD regions of the n-channel transistor with the LDD regions.

According to still another aspect of the present invention, there is provided a thin film transistor substrate comprising: a substrate; a first transistor structure having a first semiconductor layer formed on the substrate, a first gate insulating film and a first gate electrode, wherein a channel region of the first semiconductor layer under the first gate electrode is intentionally doped with only p-type impurities, the first semiconductor layer includes n-type LDD regions outside the channel region and high impurity concentration n-type source/drain regions outside the n-type LDD regions, and the first gate electrode is made of a lamination of a first metal layer and a second metal layer; a second transistor structure having a second semiconductor layer formed on the substrate, a second gate insulating film and a second gate electrode, wherein a channel region of the second semiconductor layer under the second gate electrode is intentionally doped with only p-type impurities, the second semiconductor layer includes high impurity concentration n-type source/drain regions outside the channel region, and the second gate electrode is made of a lamination of the first metal layer and the second metal layer; and a third transistor structure having a third semiconductor layer formed on the substrate, a third gate insulating film and a third gate electrode, wherein a channel region of the third semiconductor layer under the third gate electrode is intentionally doped with p-type impurities and n-type impurities, the third semiconductor layer includes high impurity concentration p-type source/drain regions outside the channel region, and the third gate electrode is made of the second metal layer.

According to still another aspect of the present invention, there is provided a thin film transistor substrate comprising: a substrate; a first transistor structure having a first semiconductor layer formed on the substrate, a first gate insulating film and a first gate electrode, wherein a channel region of the first semiconductor layer under the first gate electrode is intentionally doped with only p-type impurities, the first semiconductor layer includes n-type LDD regions outside the channel region and high impurity concentration n-type source/drain regions outside the n-type LDD regions, and the first gate electrode is made of a first metal layer; a second transistor structure having a second semiconductor layer formed on the substrate, a second gate insulating film and a second gate electrode, wherein a channel region of the second semiconductor layer under the second gate electrode is intentionally doped with p-type impurities at the first impurity concentration, the second semiconductor layer includes high impurity concentration n-type source/drain regions outside the channel region, and the second gate electrode is made of the first metal layer; and a third transistor structure having a third semiconductor layer formed on the substrate, a third gate insulating film and a third gate electrode, wherein a channel region of the third semiconductor layer under the third gate electrode is intentionally doped with p-type impurities at a second impurity concentration lower than the first impurity concentration, the third semiconductor layer includes high impurity concentration p-type source/drain regions outside the channel region, and the third gate electrode is made of a second metal layer that is different from the first metal layer.

It is possible to manufacture n- and p-channel TFTs having proper threshold values with the smaller number of masks.

DESCRIPTION OF THE PREFERRED EMBODIMENTS

With reference to FIGS. 1A to 1R and FIGS. 2A and 2B, description will be made on a thin film transistor substrate manufacture method according to the first embodiment of the invention.

As shown in FIG. 1A, on the surface of a glass substrate 10, a silicon nitride layer 11 having a thickness of about 50 nm is formed by plasma enhanced (PE) chemical vapor deposition (CVD). The silicon nitride layer 11 is a diffusion preventing film for preventing impurities from diffusing from the glass substrate 10 to upper layers. The silicon nitride layer of 50 nm or thicker can provide such a diffusion preventing function sufficiently. A general glass substrate is considered having a heat resistance temperature of about 500° C., and manufacture processes are performed at a temperature lower than this heat resistance temperature.

On the silicon nitride layer 11, a silicon oxide layer 12 having a thickness of, for example, 200 nm is deposited by plasma CVD. This silicon oxide layer provides the function of promoting crystallinity of a polysilicon layer to be formed on the silicon oxide layer. If the crystallinity promotion effect of a polysilicon layer can be obtained, a thinner silicon oxide layer may be used, for example, having a thickness of 100 nm.

On the silicon oxide layer 12, an amorphous silicon layer 13 is deposited by PECVD to a thickness of, for example, 40 nm. When the amorphous silicon layer is polycrystallized by an XeCl excimer laser beam, the amorphous silicon layer 13 is preferably in the thickness range from 40 nm to 60 nm. When a different laser beam is used for polycrystallization, the thickness of an amorphous silicon layer is preferably changed based on a laser type. For example, when a $YVO_4$ laser beam is used, a thicker amorphous silicon layer is formed, for example, to a thickness of 70 nm to 100 nm. The narrow left area in FIGS. 1A to 1R is a display area DISPLAY, and the broad right area is a peripheral circuit area PERIPHERAL. In the display area, pixel driving n-channel TFTs with LDD regions are formed, and in the peripheral circuit area, CMOSTFTs are formed.

Figure 2A:
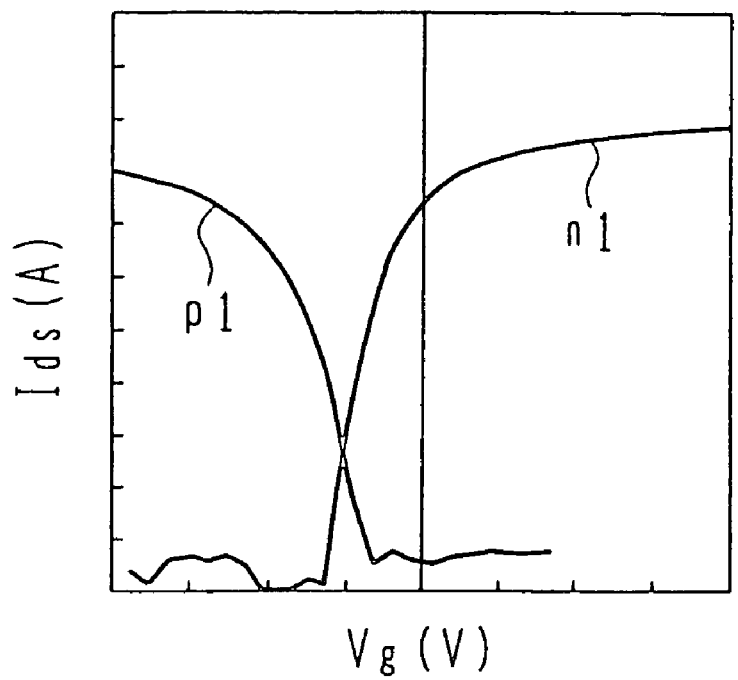
FIGS. 2A and 2B are graphs showing threshold values of transistors manufactured by the method illustrated in FIGS. 1A to 1R.

As shown in FIG. 2A, if an undoped amorphous silicon layer is formed and polycrystallized upon application of a laser beam, a thin film transistor formed by using the polysilicon layer has a threshold value largely shifted to the minus potential side. In order to adjust the threshold value to have a proper value, it is necessary to dope p-type impurities.

As shown in FIG. 1A, boron (B) ions as p-type impurities are implanted into the amorphous silicon layer 13 by using an ion doping system at an acceleration energy of 10 keV and a dose of $2\times10^{12} cm^{-2}$. This B concentration can control an n-channel TFT to have a proper threshold value.

As shown in FIG. 1B, an excimer laser beam Ex is applied to the amorphous silicon layer 13 to crystallize it. The amorphous silicon layer melts and hardens to be changed to a polysilicon layer.

As shown in FIG. 1C, a resist pattern M11 of an island shape corresponding to each TFT is formed on the polysilicon layer 13. By using the resist pattern M11 as an etching mask, the polysilicon layer 13 exposed outside the resist pattern M11 is dry-etched by fluorine-containing gas. The resist pattern M11 is thereafter removed.

As another method of doping B into the amorphous silicon layer 13, $B_2H_6$ gas as B source may be added to $SiH_4$ gas as silicon source by about several ppm when the amorphous silicon layer is formed. The order of the B ion doping process and the crystallization process by excimer laser may be reversed. After the polysilicon layer is patterned to island areas, B ions may be implanted.

Three island polysilicon layers shown in FIG. 1C are: a left polysilicon region 13a which is used for forming an n-channel TFT with the LDD regions in the display area; a center polysilicon region 13b which is used for forming an n-channel TFT without LDD regions in the peripheral circuit area; and a right polysilicon region 13c which is used for forming a p-channel TFT without LDD regions in the peripheral circuit area.

The n-channel TFT of the peripheral circuit does not have the LDD regions in this example. If a CMOS circuit is to be made by n-channel TFTs with LDD regions and p-channel TFTs without LDD regions, the center TFT is formed by the method similar to that used for the left TFT.

As shown in FIG. 1D, a silicon oxide layer 15 having a thickness of about 30 nm is formed, for example, by PECVD, covering the island polysilicon layers 13a to 13c. This silicon oxide layer 15 is an insulating layer to be used as a gate insulating film. On the silicon oxide layer 15, an Mo layer 16 is formed by sputtering to a thickness of, for example, 200 nm. The Mo layer is a first metal layer functioning as a mask and an etching stopper in the later processes and also constituting a part of each gate electrode.

The gate insulating film is made as thin as about 30 nm by considering a later ion implantation process of implanting ions through the gate insulating film. However, the gate insulating film may be made thick, for example, about 100 nm by correspondingly raising the acceleration energy in the later ion implantation process.

Figure 1E:
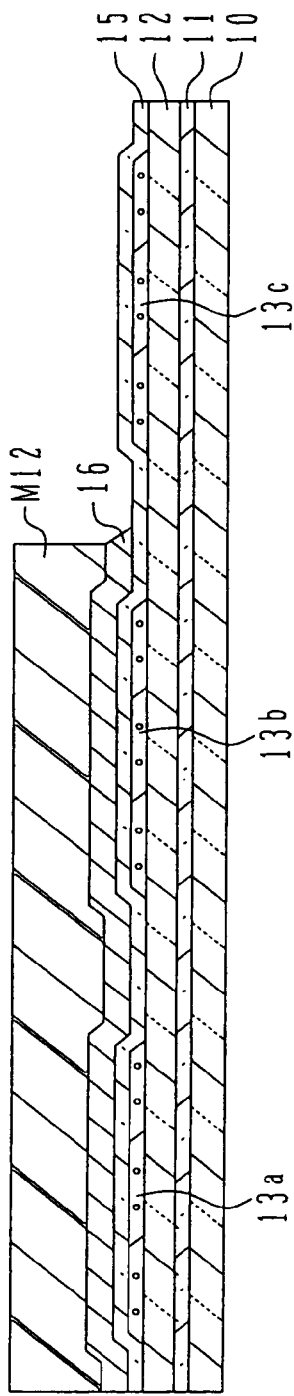
FIGS. 1A to 1R are schematic cross sectional views illustrating a thin film transistor substrate manufacture method according to a first embodiment of the invention.

As shown in FIG. 1E, a resist mask M12 is formed on the Mo layer 16, covering the n-channel TFT area. The MO layer 16 in the p-channel TFT area is removed, for example, by wet etching. The resist pattern M12 is thereafter removed. The left Mo layer 16 functions as a mask covering the n-channel TFT area.

Figure 1F:
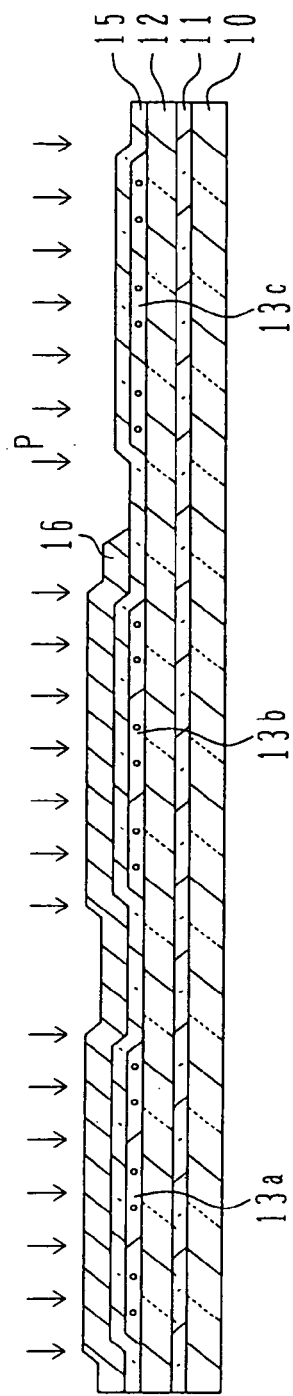

As shown in FIG. 1F, phosphorus (P) ions as n-type impurities are implanted by using an ion doping system under the conditions of, for example, an acceleration energy of 30 keV and a dose of $1\times10^{12} cm^{-2}$. Since the Mo layer 16 covers the n-channel TFT area, P ions are implanted only into the p-channel transistor region 13c through the gate insulating film. A portion of B impurity ions implanted in the process shown in FIG. 1A is cancelled out by P impurity ions implanted in the process shown in FIG. 1F, so that a proper threshold value is set to the p-channel TFT area.

Figure 1G:
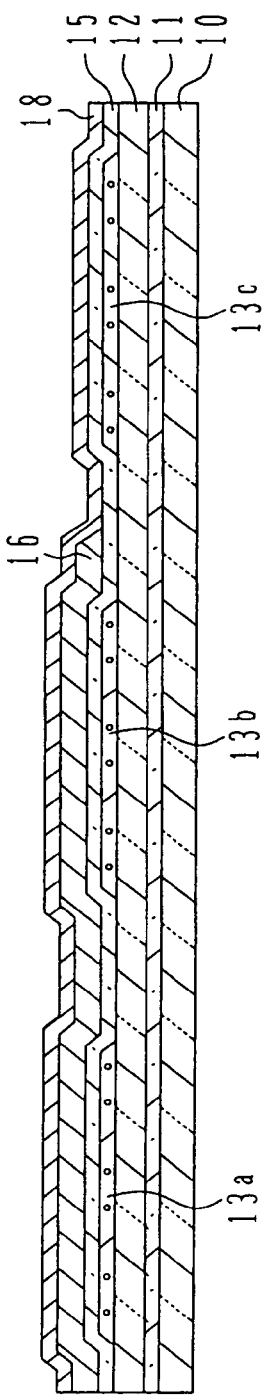

As shown in FIG. 1G, covering the left Mo layer 16 and exposed gate insulating film 15, an Al—Ti alloy layer 18 having a thickness of, for example, 300 nm, is formed by sputtering. The Al—Ti alloy layer 18 is a second metal layer to be used for gate electrodes. At least one of the first metal layer formed in the process shown in FIG. 1D and the second metal layer formed in the process shown in FIG. 1G forms gate electrodes. The first and second metal layers have different etching characteristics. Other conductive layers may be used in place of the metal layers. For example, a conductive semiconductor layer, a metal silicide layer, a conductive metal nitride layer or the like may be used.

As shown in FIG. 1H, a resist pattern M13 having a gate electrode shape is formed on the Al—Ti alloy layer 18 to dry-etch this layer by chlorine containing gas. The resist pattern M13 is thereafter removed. A gate electrode Gp of Al—Ti alloy is therefore formed on the gate insulating film 15 in the p-channel TFT area. The Mo layer 16 as the first metal layer is not etched and covers the n-channel TFT area.

As shown in FIG. 1I, by using the left Mo layer 16 and gate electrode Gp as a mask, high concentration p-type impurities, for example, B ions, are implanted into the p-channel TFT area. For example, B ions are implanted at an acceleration energy of 30 keV and a dose of $2\times10^{15} cm^{-2}$. High impurity concentration source-drain regions 19 of a p-channel TFT are therefore formed continuously with the channel region under the gate electrode Gp.

As shown in FIG. 1J, by using the Al—Ti electrode layers 18x and 18y as a mask, the underlying Mo layer 16 is dry-etched by fluorine containing gas. A gate electrode Gd of an n-channel TFT with the LDD regions is therefore formed, the gate electrode Gd being a lamination of a first metal layer 16x and a second metal layer 18x. A gate electrode Gn of a CMOS n-channel TFT without LDD regions is therefore formed, the gate electrode Gn being a lamination of a first metal layer 16y and a second metal layer 18y.

As shown in FIG. 1K, low concentration n-type impurities, for example, P ions, are implanted. P ions are implanted by using an ion doping system under the conditions of, for example, an acceleration energy of 30 keV and a dose of $5\times10^{13} cm^{-2}$. This P ion implantation forms low impurity concentration regions 21 of the n-channel TFTs. Although the effective impurity concentration of the high impurity concentration source/drain regions 19 lowers slightly, the influence of this can be neglected.

Figure 1L:
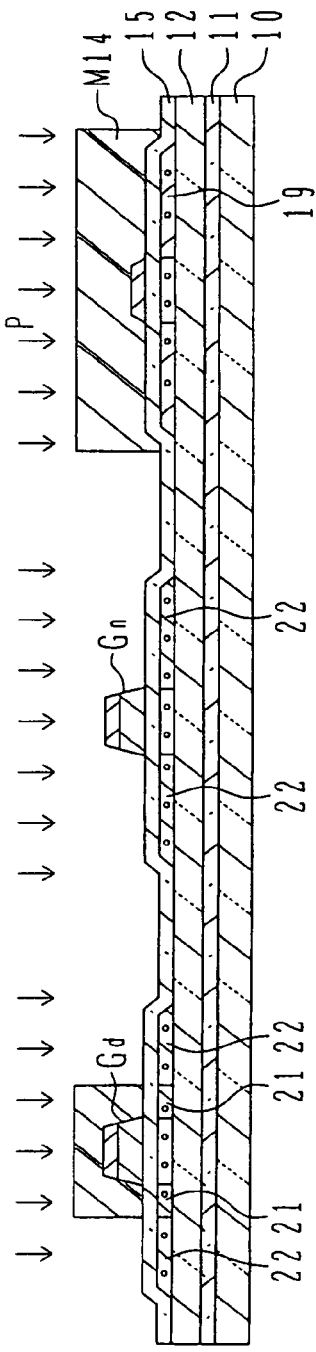

As shown in FIG. 1L, a resist pattern M14 is formed covering the channel and LDD regions of the n-channel TFT and the p-channel TFT area, and high concentration n-type impurities, for example, P ions, are implanted. P ions are implanted by using an ion doping system under the conditions of, for example, an acceleration energy of 30 keV and a dose of $2\times10^{15} cm^{-2}$. High impurity concentration source/drain regions 22 are therefore formed in the n-channel TFT. The resist pattern M14 is thereafter removed.

Figure 1M:
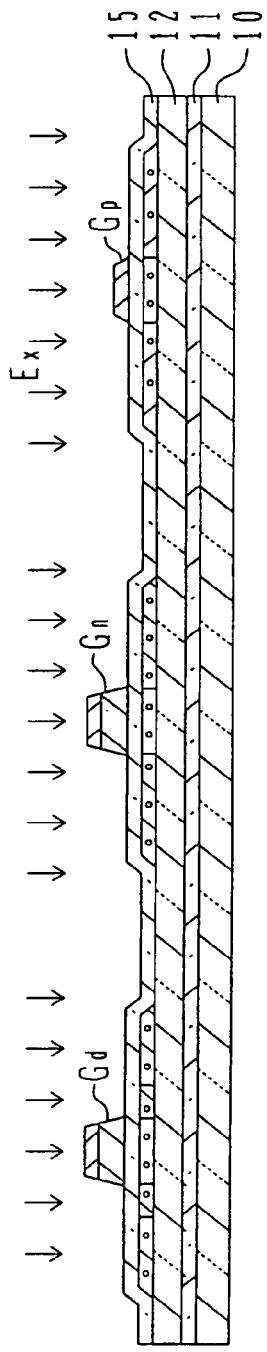

As shown in FIG. 1M, an excimer laser beam Ex is applied to activate the implanted impurities. An activation method may be other well-known methods, such as lamp annealing.

As described above, the first metal layer is formed covering the n-channel TFTs, and used as a mask when ions are implanted for the control of the threshold value of the p-channel TFT. The second metal layer is etched to form a gate electrode pattern. The first metal layer is also used as a hard mask on the n-channel TFTs when ions are implanted to form the source/drain regions of the p-channel TFT. Thereafter, the first metal layer is etched by using the second metal layer as a mask. Only four masks are used to form three types of TFT structures. Since the number of masks can be reduced, a thin film transistor substrate can be formed at a low manufacture cost while a high productivity is retained.

A thin film transistor substrate is completed thereafter by a usual manufacture method.

Figure 1N:
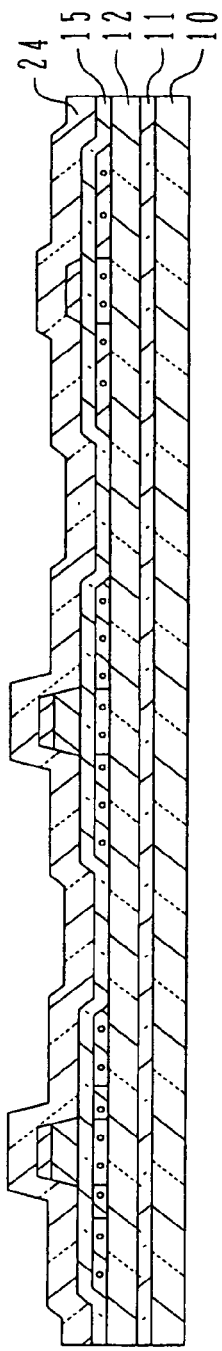

As shown in FIG. 1N, an interlayer insulating film 24 containing hydrogen is formed by PECVD. For example, a silicon nitride film 24 having a thickness of 370 nm is formed by PECVD using $SiH_4$ and $NH_3$ as source gases. Thereafter, annealing is performed for 2 hours at 380° C. in a nitrogen atmosphere in order to hydrogenate the polysilicon layer. Since $SiH_4$ and $NH_3$ are used as the source gases, the silicon nitride layer 24 contains a large amount of hydrogen. This hydrogen is diffused into the polysilicon layer and terminates dangling bonds.

Figure 1O:
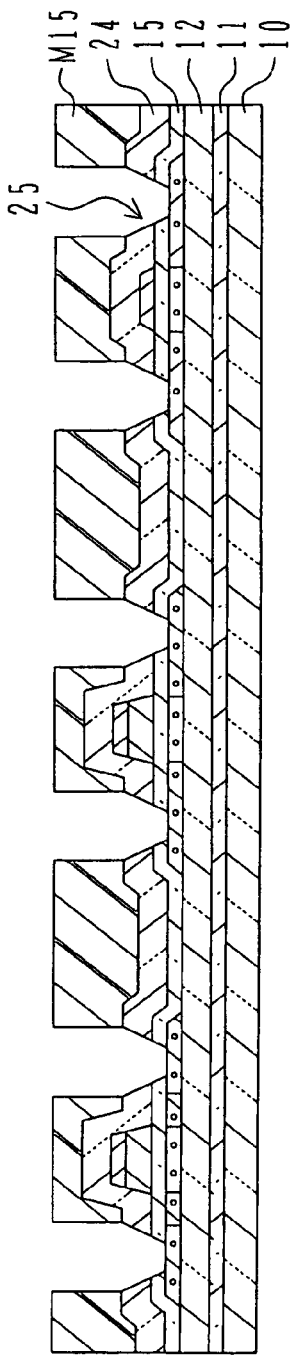

As shown in FIG. 1O, a resist mask M15 is formed on the interlayer insulating film 24, the resist mask having contact openings. By using the resist mask M15 as an etching mask, the interlayer insulating film 24 and gate insulating film 15 are dry-etched by fluorine-containing gas. Contact holes 25 are therefore formed exposing the high impurity concentration source/drain regions of each TFT. The resist mask M15 is thereafter removed.

Figure 1P:
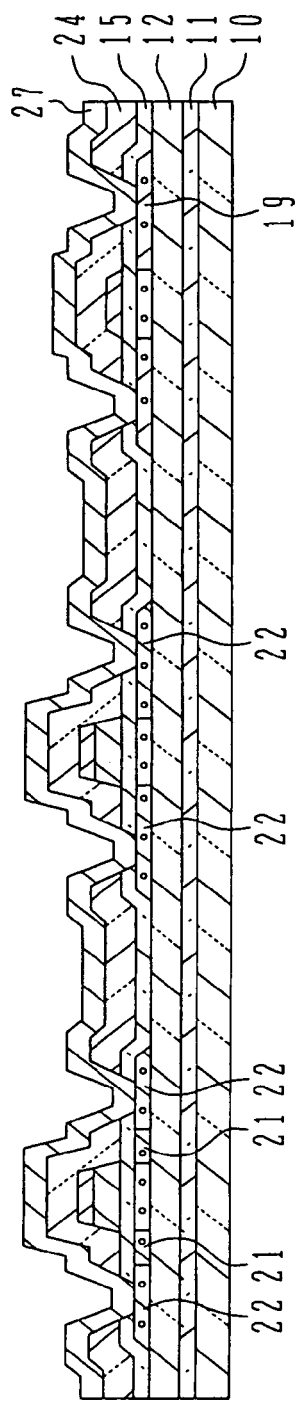

As shown in FIG. 1P, a third metal layer 27 for electrodes and wiring is formed on the interlayer insulating film 24. For example, a Ti layer about 100 nm thick, an Al layer about 200 nm thick, and a Ti layer about 100 nm thick are stacked by sputtering to form the third metal layer 27.

Figure 1Q:
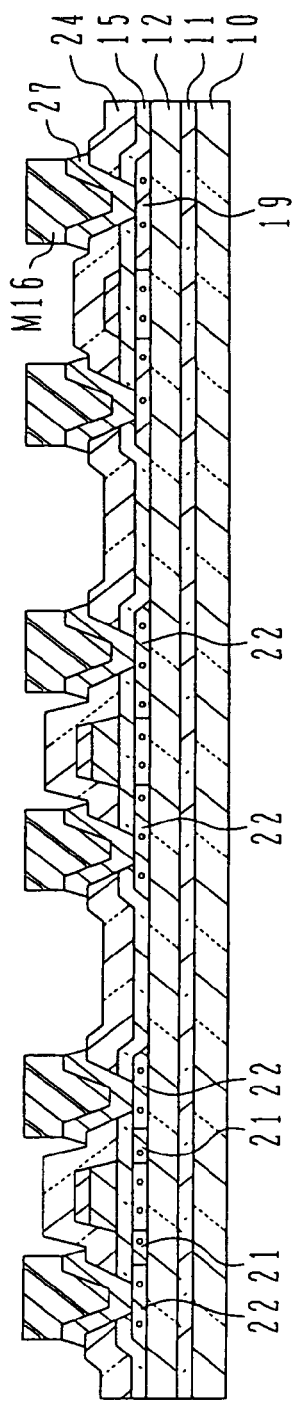
Figure 1R:
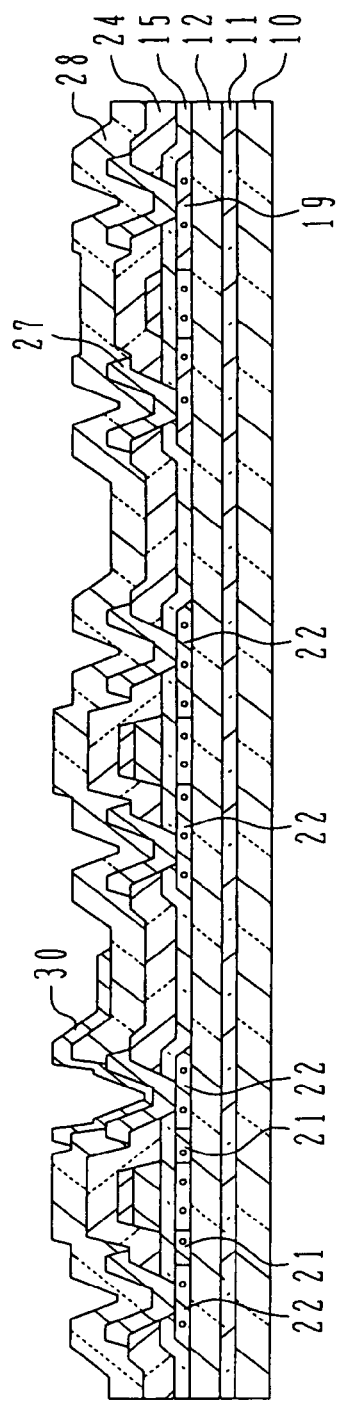

As shown in FIG. 1Q, a resist pattern M16 is formed on the third metal layer and dry-etched by chlorine-containing gas to pattern the third metal layer 27. In FIG. 1Q, although only the electrodes in contact with the polysilicon layers in the source/drain regions are shown, the third metal layer 27 also forms a wiring pattern in other areas. The resist pattern M16 is thereafter removed.

As shown in FIG. 1R, a second interlayer insulating film 28 is formed covering the third metal layer 27. An etching process similar to that described with reference to FIG. 1O is performed to form an opening for the drain region of the n-channel TFT with the LDD regions in the display area. A transparent electrode layer of ITO or the like is formed to a thickness of about 70 nm, and etched by using a resist pattern to form a pixel transparent electrode 30.

With the above processes, the thin film transistor substrate for a liquid crystal display can be formed.

Figure 2B:
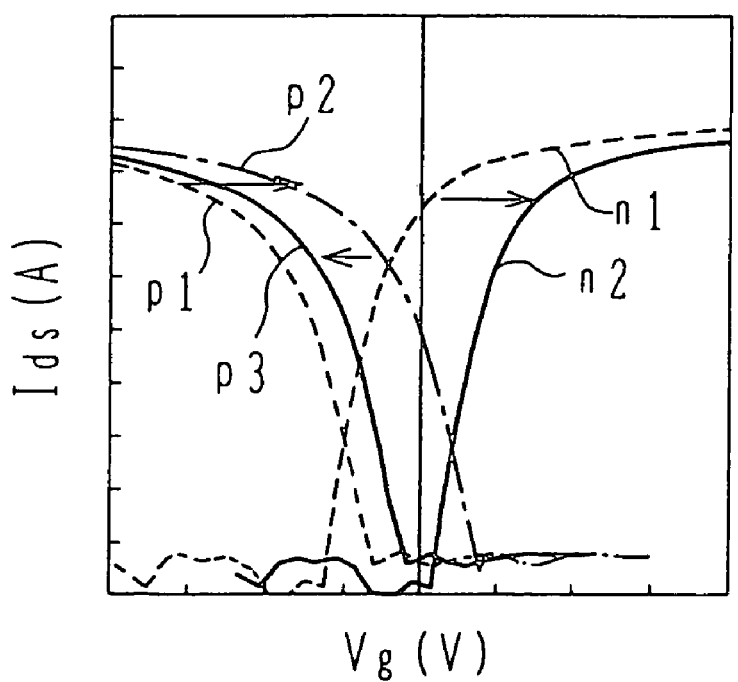

As shown in FIG. 2B, in the n-channel TFT area, the B ion implantation shown in FIG. 1A changes the drain current Ids—gate voltage Vg characteristics n1 to the characteristics n2 having proper rising characteristics.

In the p-channel TFT area, the B ion implantation shown in FIG. 1A changes once the undoped characteristics p1 to the characteristics p2, and thereafter, the P ion implantation shown in FIG. 1F cancels out a portion of the p-type impurities to change the characteristics p2 to the characteristics p3. Therefore, n-channel TFTs and p-channel TFT can be formed which have a small leak current at the gate voltage Vg of 0 and proper threshold values.

FIGS. 3A to 3J illustrate a thin film transistor substrate manufacture method according to the second embodiment of the invention. Like elements to those of the first embodiment are represented by using identical symbols and the description thereof is simplified.

First, similar to the first embodiment, on a glass substrate 10, a silicon nitride layer 11 about 50 nm thick, a silicon oxide layer 12 about 200 nm thick and an amorphous silicon layer 13 about 40 nm thick are formed. In this state, p-type impurities, for example, B ions, are implanted at an acceleration energy of 10 keV and a dose of $1\times10^{12} cm^{-2}$. In this embodiment, the B ion implantation is performed to set a proper threshold value of the p-channel TFT, which is different from the first embodiment. The dose of B ions in the n-channel TFTs is insufficient and proper threshold values are not set as yet.

Thereafter, the processes similar to the first embodiment are performed including a polycrystallization process for the amorphous silicon layer upon application of an excimer laser beam, a patterning process for the polysilicon layer using a resist mask, and film forming processes for a gate insulating film 15 and a first gate electrode layer 16.

Figure 3A:
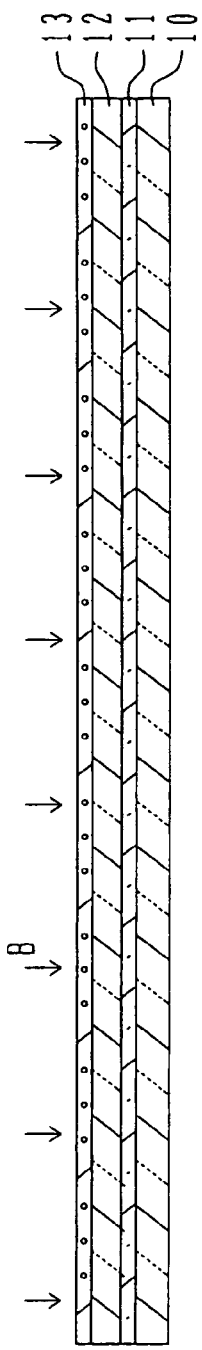
FIGS. 3A to 3J are schematic cross sectional views illustrating a thin film transistor substrate manufacture method according to a second embodiment of the invention.
Figure 3B:
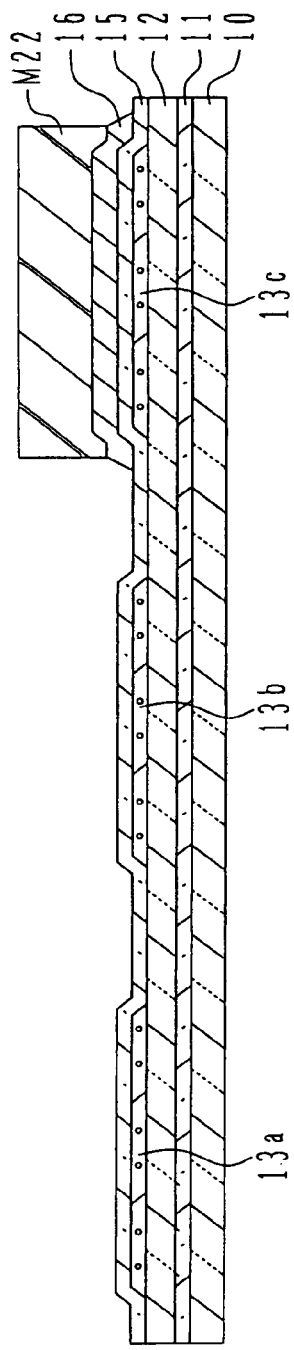

As shown in FIG. 3B, by using a resist mask M22, the first gate electrode layer 16 is patterned. The first gate electrode layer 16 is patterned to cover the p-channel TFT area and expose the n-channel TFT area. The resist mask M22 is thereafter removed.

Figure 3C:
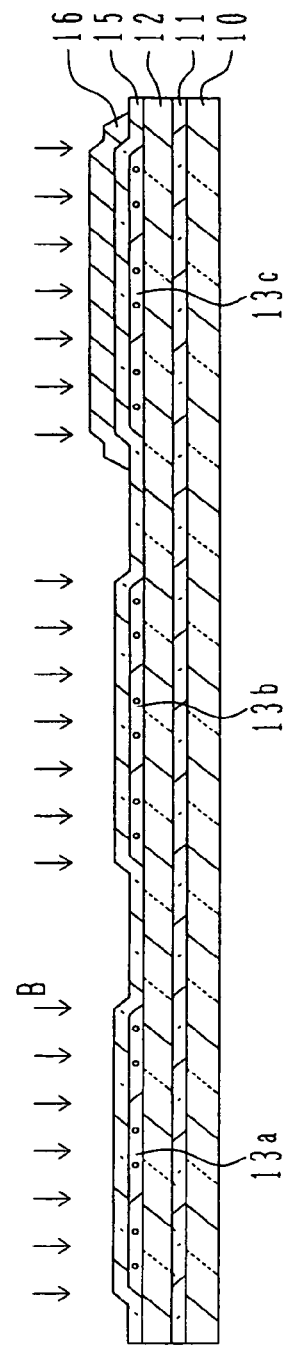

As shown in FIG. 3C, low concentration p-type impurities, for example, B ions, are implanted by using an ion doping system. For examples, B ions are implanted at an acceleration energy of 30 keV and a dose of $1\times10^{12} cm^{-2}$ by using an ion doping system.

B ions are additionally implanted in the n-channel TFT area where the first gate electrode layer 16 is not formed, so that proper threshold values are set to the channel regions.

Figure 3D:
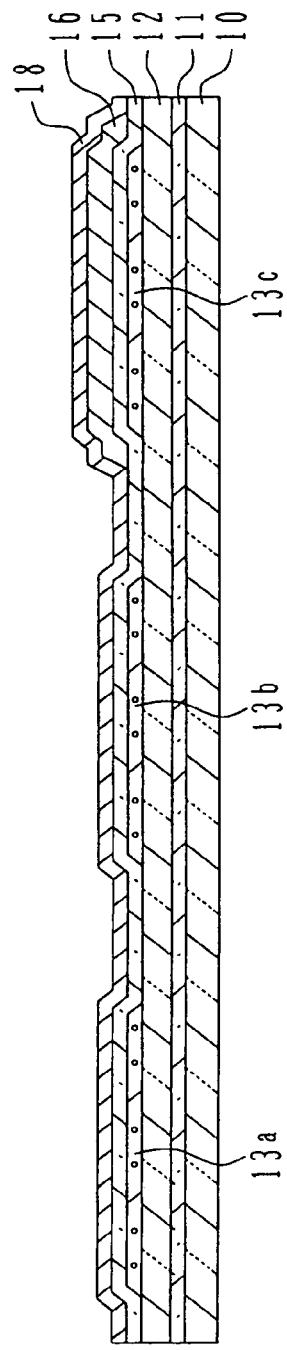

As shown in FIG. 3D, a second gate electrode layer 18 is formed by sputtering, the layer 18 covering the first gate electrode layer 16 and exposed gate insulating film 15. For example, an Al—Ti alloy layer is formed by sputtering to a thickness of about 300 nm.

Figure 3E:
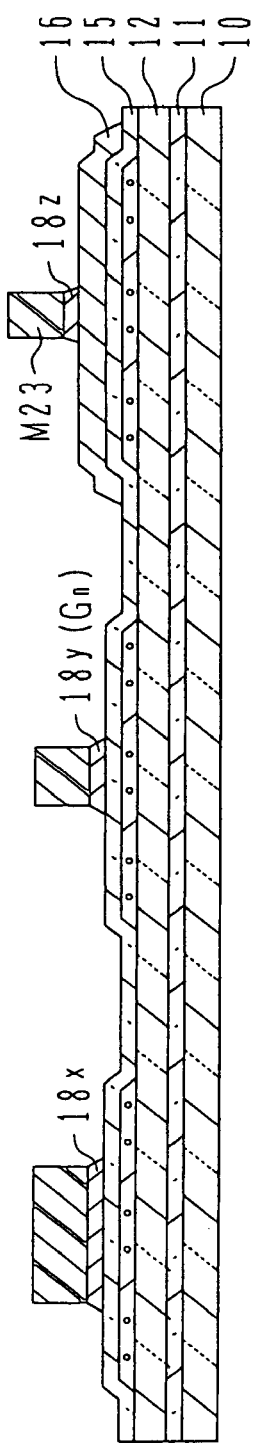

As shown in FIG. 3E, a resist pattern M23 is formed on the second gate electrode layer 18, and the second gate electrode layer 18 is patterned. In the area of the n-channel TFT with the LDD regions, a second gate electrode layer 18x is formed by using the resist pattern defining LDD regions. In the area of the CMOS n-channel TFT, a gate electrode 18y is formed by using the resist pattern having a gate electrode shape. In the area of the CMOS p-channel TFT, a second gate electrode layer 18z is formed by using the resist pattern having a gate electrode shape. The first gate electrode layer 16 covering the p-channel TFT area is still left under the second gate electrode layer 18z.

Figure 3F:
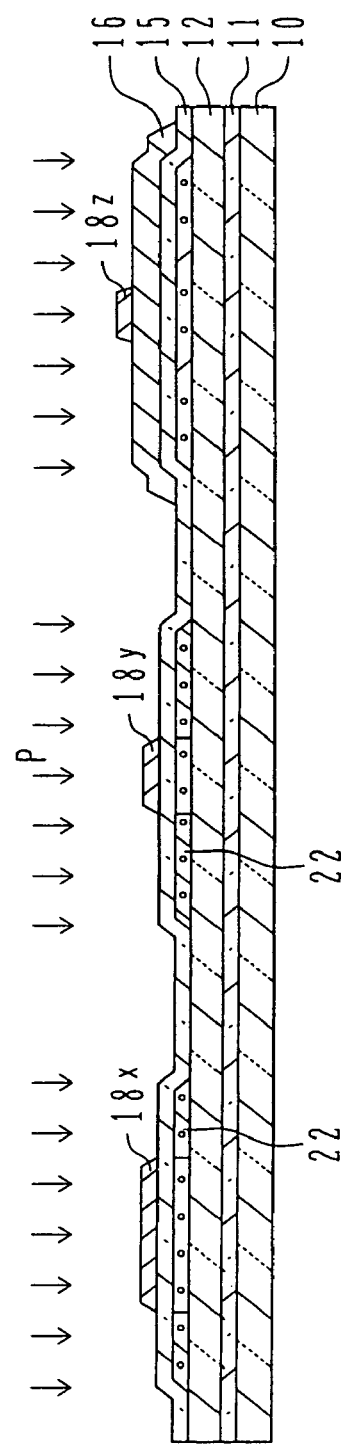

As shown in FIG. 3F, high concentration n-type impurities, for example, P ions, are implanted by using an ion doping system to form high impurity concentration source/drain regions 22 of n-channel TFTs. For example, P ions are implanted at an acceleration energy of 30 keV and a dose of $2\times10^{15} cm^{-2}$.

Figure 3G:
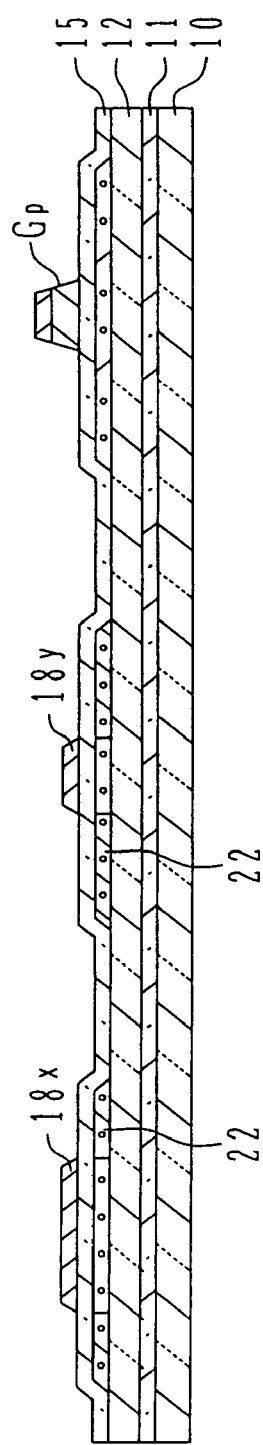

As shown in FIG. 3G, by using the second gate electrode layer 18z as a mask, the underlying first gate electrode layer 16 is dry-etched by fluorine-containing gas. A gate electrode Gp is therefore formed, which is a lamination of the first and second gate electrode layers 16 and 18.

Figure 3H:
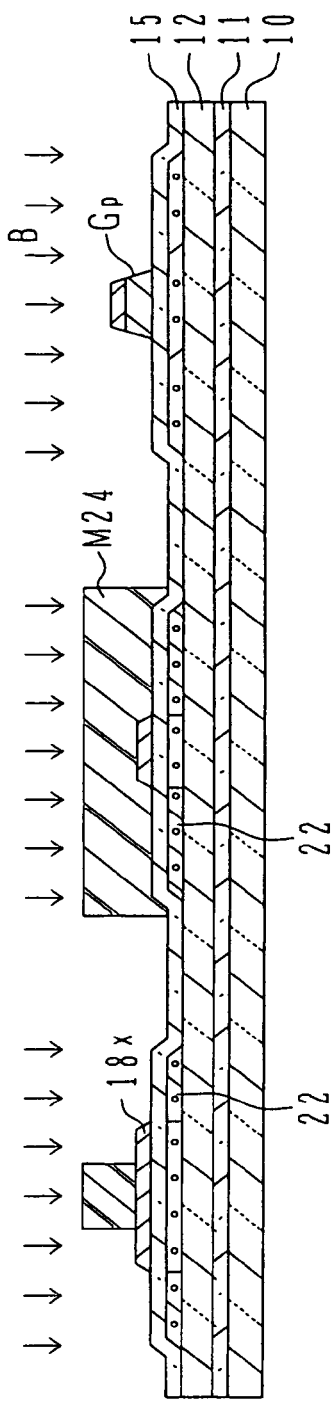

As shown in FIG. 3H, a resist pattern M24 is formed covering the second gate electrode layer 18x in a gate electrode shape in the area of the n-channel TFT with the LDD regions and covering the area of the n-channel TFT without LDD regions.

By using the gate electrode Gp as a mask, high concentration p-type impurity ions are implanted to form high impurity concentration source/drain regions of the p-channel TFT. In this case, although a portion of n-type impurities are cancelled out in the n-channel TFT with the LDD regions, the impurity concentration is selected so that the remaining n-type impurities retain the high impurity concentration source/drain regions. For example, B ions are implanted at an acceleration energy of 30 keV and a dose of $1\times10^{15}$cm$^{-2}$.

Figure 3I:
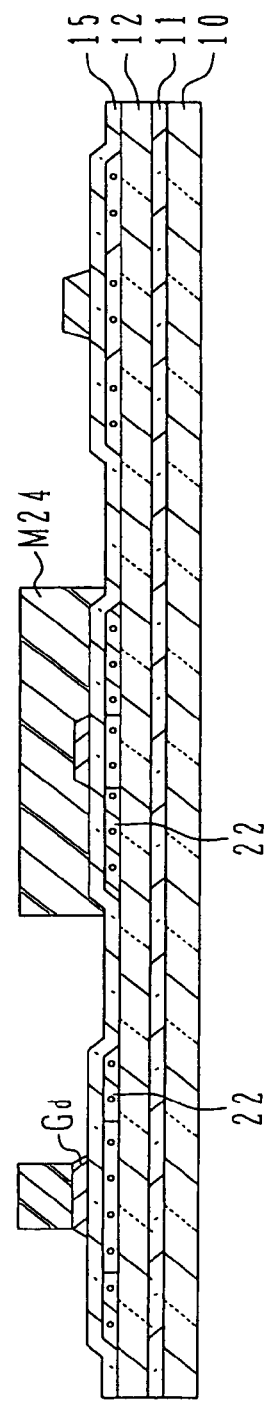

As shown in FIG. 3I, by using the resist mask M24 as an etching mask, the second gate electrode layer 18x is etched. In the area of the n-channel TFT with the LDD regions, the second gate electrode layer 18x outside the resist mask is etched and patterned to form a gate electrode Gd. In the p-channel TFT area, the second gate electrode layer on the first gate electrode layer is etched and only the first gate electrode layer is left.

The resist mask M24 may be formed after the ion implantation shown in FIG. 3H to pattern and form the gate electrode Gd of the n-channel TFT with the LDD regions.

Figure 3J:
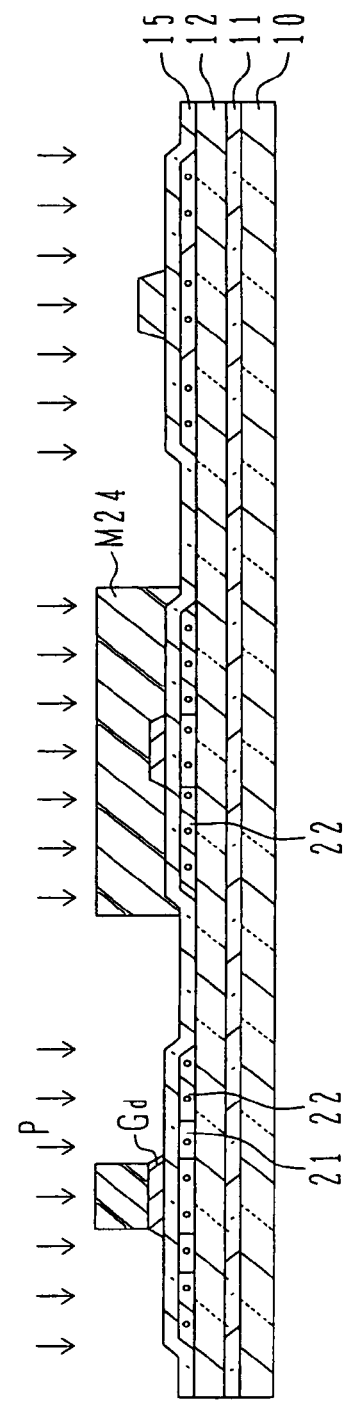

As shown in FIG. 3J, low concentration n-type impurities, for example, P ions, are implanted to form LDD regions 21. For example, P ions are implanted at an acceleration energy of 30 keV and a dose of $5\times10^{13}$cm$^{-2}$. The resist mask M24 is thereafter removed. After the resist mask M24 is removed, low concentration n-type impurity ions may be implanted.

Figure 4A:
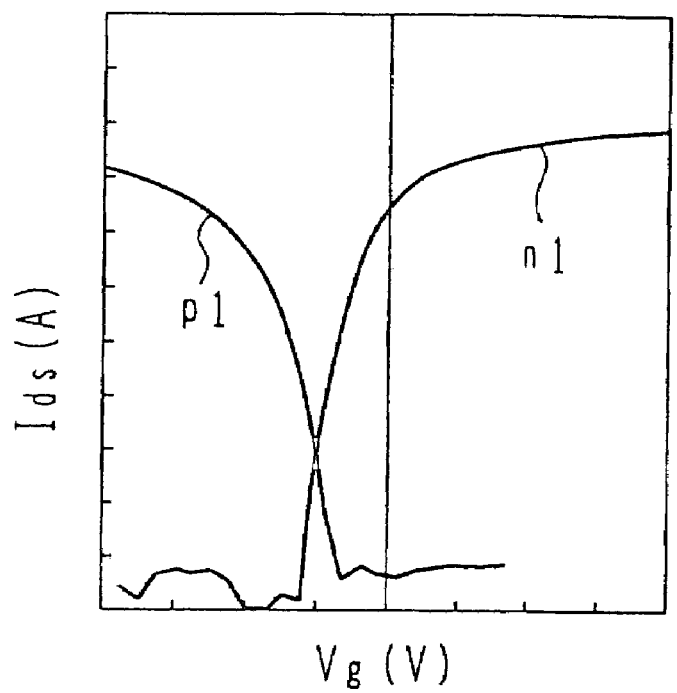
FIGS. 4A and 4B are graphs showing threshold values of transistors manufactured by the method illustrated in FIGS. 3A to 3J.

As shown in FIG. 4A, if an undoped polysilicon layer is used, the threshold values of both the p-channel TFT and n-channel TFTs shift largely to the minus potential side.

Figure 4B:
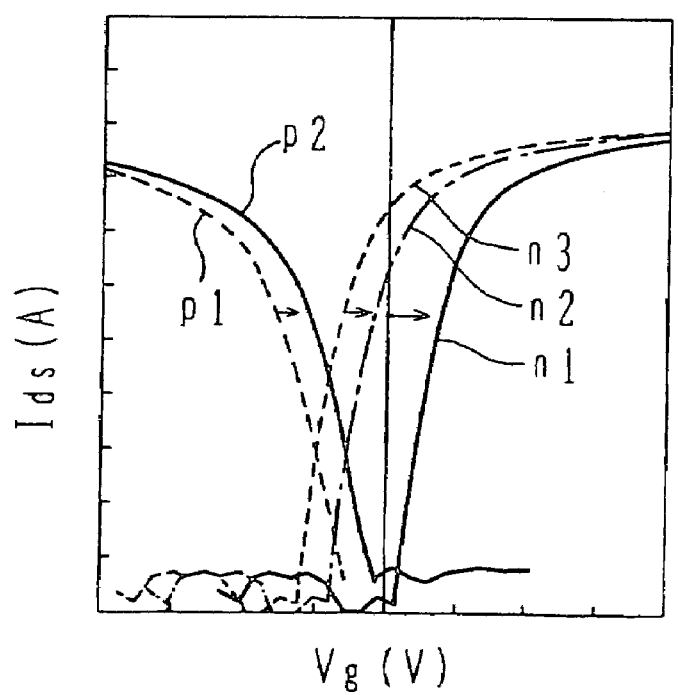

As shown in FIG. 4B, in the p-channel TFT area, the B ion implantation shown in FIG. 3A changes the undoped characteristics p1 to the characteristics p2 having a proper threshold value. In the n-channel TFT area, the B ion implantation shown in FIG. 3A changes once the characteristics n1 to the characteristics n2, and thereafter, the B ion additional implantation shown in FIG. 3C changes the characteristics n2 to the characteristics n3 setting the proper threshold values of the n-channel TFTs. Therefore, both n-channel TFTs and p-channel TFT can have proper threshold values. Also in the second embodiment, three types of TFT structures and proper threshold values can be obtained by using the four masks.

The CMOS n-channel TFT may be an n-channel TFT with the LDD regions, as mentioned in the first embodiment. In this case, two types of transistor structures are formed. The method of forming the upper layer structure after the transistor structures are formed is similar to the first embodiment.

Figure 5A:
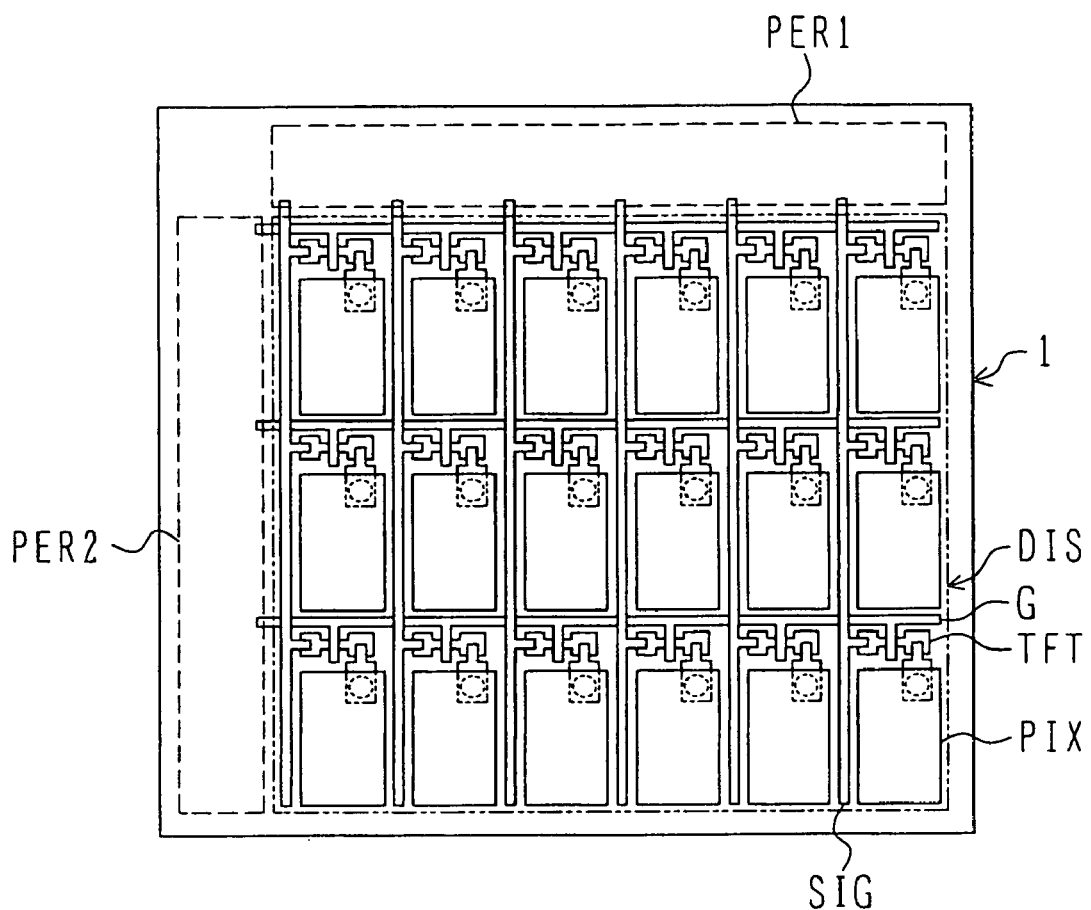
FIGS. 5A and 5B are a plan view and a schematic cross sectional view illustrating a liquid crystal display using a thin film transistor substrate formed by the embodiment method.

FIG. 5A is a schematic diagram showing the structure of a thin film transistor substrate formed by the embodiment method. A number of pixels PIX are disposed in a matrix shape in a display area DIS of a thin film transistor substrate 1. In each pixel PIX, a transparent pixel electrode is connected to a corresponding thin film transistor TFT. Gate electrodes of thin film transistors TFTs and gate wiring lines G are formed at a time by the same process. Electrodes of the source/drain regions of thin film transistors and signal wiring lines SIG are formed at a time by the same process. Peripheral circuits PER1 and PER2 are formed in upper and left areas relative to the display area DIS.

Figure 5B:
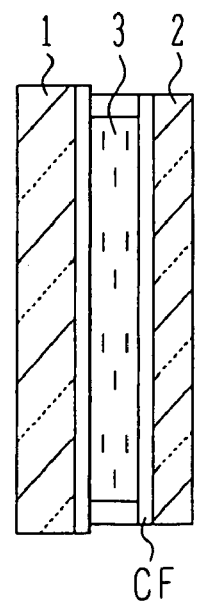

FIG. 5B is a schematic diagram showing the structure of a liquid crystal display formed by using such a thin film transistor substrate. A thin film transistor substrate 1 and an opposing substrate 2 formed with a color filter are disposed facing each other and a liquid crystal layer 3 is filled in a space between the two substrates.

The present invention has been described in connection with the preferred embodiments. The invention is not limited only to the above embodiments. For example, although the first and second conductive layers constituting gate electrodes are required to have different etching characteristics, the materials of the first and second conductive layers are not limited to those described in the embodiments. The interlayer insulating film is not limited to that described in the embodiment, but various inorganic or organic films may be used.

Although thin film transistors are formed on a glass substrate, they may be formed on a different transparent substrate such as a quartz substrate. In this case, thermal restrictions can be mitigated so that the selection degree of processes can be improved. It will be apparent to those skilled in the art that other various modifications, improvements, combinations, and the like can be made.

I claim:

1. A thin film transistor substrate comprising:
    a substrate;
    a first transistor structure having a first semiconductor layer formed on said substrate, a first gate insulating film and a first gate electrode, wherein a channel region of said first semiconductor layer under said first gate electrode is intentionally doped with only p-type impurities, said first semiconductor layer includes n-type LDD regions outside the channel region and high impurity concentration n-type source/drain regions outside the n-type LDD regions, and said first gate electrode is made of a lamination of a first metal layer and a second metal layer;
    a second transistor structure having a second semiconductor layer formed on said substrate, a second gate insulating film and a second gate electrode, wherein a channel region of said second semiconductor layer under said second gate electrode is intentionally doped with only p-type impurities, said second semiconductor layer includes high impurity concentration n-type source/drain regions outside the channel region, and said second gate electrode is made of a lamination of said first metal layer and said second metal layer; and
    a third transistor structure having a third semiconductor layer formed on said substrate, a third gate insulating film and a third gate electrode, wherein a channel region of said third semiconductor layer under said third gate electrode is intentionally doped with p-type impurities and n-type impurities, said third semiconductor layer includes high impurity concentration p-type source/drain regions outside the channel region, and said third gate electrode is made of said second metal layer.

2. The thin film transistor substrate according to claim 1, wherein said second semiconductor layer has n-type LDD regions outside the channel region, and the high impurity concentration n-type source/drain regions outside the n-type LDD regions.

3. The thin film transistor substrate according to claim 1, wherein said first and second metal layers have different etching characteristics.

4. The thin film transistor substrate according to claim 3, wherein said first metal layer is a refractory metal layer and said second metal layer is an aluminum alloy layer.

5. A thin film transistor substrate comprising:

a substrate;

a first transistor structure having a first semiconductor layer formed on said substrate, a first gate insulating film and a first gate electrode, wherein a channel region of said first semiconductor layer under said first gate electrode is intentionally doped with only p-type impurities, said first semiconductor layer includes n-type LDD regions outside the channel region and high impurity concentration n-type source/drain regions outside the n-type LDD regions, and said first gate electrode is made of a first metal layer;

a second transistor structure having a second semiconductor layer formed on said substrate, a second gate insulating film and a second gate electrode, wherein a channel region of said second semiconductor layer under said second gate electrode is intentionally doped with p-type impurities at the first impurity concentration, said second semiconductor layer includes high impurity concentration n-type source/drain regions outside the channel region, and said second gate electrode is made of said first metal layer; and a third transistor structure having a third semiconductor layer formed on said substrate, a third gate insulating film and a third gate electrode, wherein a channel region of said third semiconductor layer under said third gate electrode is intentionally doped with p-type impurities at a second impurity concentration lower than the first impurity concentration, said third semiconductor layer includes high impurity concentration p-type source/drain regions outside the channel region, and said third gate electrode is made of a second metal layer that is different from said first metal layer.

6. The thin film transistor substrate according to claim 5, wherein said second semiconductor layer has n-type LDD regions outside the channel region, and the high impurity concentration n-type source/drain regions outside the n-type LDD regions.

7. The thin film transistor substrate according to claim 5, wherein said first metal layer has etching characteristics different from those of said second metal layer.

8. The thin film transistor substrate according to claim 7, wherein said first metal layer is a refractory metal layer and said second metal layer is an aluminum alloy layer.

* * * * *